United States Patent
Haba et al.

(10) Patent No.: US 7,534,652 B2
(45) Date of Patent: May 19, 2009

(54) MICROELECTRONIC ELEMENTS WITH COMPLIANT TERMINAL MOUNTINGS AND METHODS FOR MAKING THE SAME

(75) Inventors: Belgacem Haba, Saratoga, CA (US);
Ilyas Mohammed, Santa Clara, CA (US); Craig S. Mitchell, San Jose, CA (US); Michael Warner, San Jose, CA (US); Jesse Burl Thompson, Brentwood, CA (US)

(73) Assignee: Tessera, Inc., San Jose, CA (US)

( * ) Notice: Subject to any disclaimer, the term of this patent is extended or adjusted under 35 U.S.C. 154(b) by 410 days.

(21) Appl. No.: 11/318,846

(22) Filed: Dec. 27, 2005

(65) Prior Publication Data

US 2007/0145550 A1    Jun. 28, 2007

(51) Int. Cl.
*H01L 21/44* (2006.01)
(52) U.S. Cl. .................. 438/108; 438/117; 438/611
(58) Field of Classification Search ......... 438/106–109, 438/117, 461, 611; 257/E21.503, E21.511, 257/E23.021
See application file for complete search history.

(56) References Cited

U.S. PATENT DOCUMENTS

| | | | |
|---|---|---|---|
| 5,679,977 A | 10/1997 | Khandros et al. | |
| 6,211,572 B1 | 4/2001 | Fjelstad et al. | |
| 6,277,669 B1 * | 8/2001 | Kung et al. | 438/106 |
| 6,286,205 B1 | 9/2001 | Faraci et al. | |
| 6,444,489 B1 * | 9/2002 | Lin | 438/107 |
| 6,774,317 B2 | 8/2004 | Fjelstad | |
| 6,847,101 B2 | 1/2005 | Fjelstad et al. | |
| 7,176,043 B2 | 2/2007 | Haba et al. | |
| 2004/0259290 A1 * | 12/2004 | Brintzinger et al. | 438/111 |
| 2005/0173805 A1 | 8/2005 | Damberg et al. | |
| 2005/0181655 A1 | 8/2005 | Haba et al. | |
| 2007/0145536 A1 | 6/2007 | Nystrom | |

* cited by examiner

*Primary Examiner*—Hung Vu
(74) *Attorney, Agent, or Firm*—Lerner, David, Littenberg, Krumholz & Mentlik, LLP (57) ABSTRACT

A dielectric structure is formed by a molding process, so that a first surface of a dielectric structure is shaped by contact with the mold. The opposite second surface of the dielectric structure is applied onto the front surface of a wafer element. The dielectric layer may include protruding bumps and terminals may be formed on the bumps. The bumps may be of a precise height. The terminals lie at a precisely controlled height above the front surface of the wafer element. The terminals may include projecting posts which extend above a surrounding solder mask layer to facilitate engagement with a test fixture. The posts are immersed within solder joints when the structure is bonded to a circuit panel.

19 Claims, 9 Drawing Sheets

MICROELECTRONIC ELEMENTS WITH COMPLIANT TERMINAL MOUNTINGS AND METHODS FOR MAKING THE SAME

BACKGROUND OF THE INVENTION

Semiconductor chips commonly are formed by processing a large flat body of semiconductor material referred to as a wafer to form numerous regions, each including the electronic circuitry to be incorporated in a single chip, and then cutting the wafer along saw lanes to sever the wafer and thus form individual chips. Each chip typically is a flat rectangular body with generally planar front and rear surfaces and with small edges extending between the front and rear surfaces at the boundaries of these surfaces. Each chip typically has contacts exposed at the front surface which are electrically connected to the circuitry within the chip.

The individual chips commonly are provided in packages which facilitate handling of the chip and mounting of the chip to an external substrate, such as a circuit board or other printed circuit panel. Such packages commonly include a dielectric structure and electrically conductive terminals carried on the dielectric structure, the terminals being electrically connected to the contacts of the chip. In a package of the type referred to a chip scale package, the package occupies an area on the circuit panel only slightly larger than, or the same size as, the area of the chip front surface itself.

As disclosed, for example, in U.S. Pat. No. 5,679,977, the disclosure of which is hereby incorporated by reference herein, the terminals may be movable with respect to the chip. In certain embodiments, the package may incorporate a compliant layer overlying a surface of the chip and carrying the terminals. Movability of the terminals with respect to the chip can compensate for differential thermal expansion between the chip and the circuit panel during manufacture, during service, or both. Also, movability of the terminals with respect to the chip can facilitate engagement of the packaged chip with a testing device. During such engagement, the individual terminals may move in the direction towards or away from the front or rear surface of the chip, commonly referred to as the vertical or "Z" direction. Movement in this direction facilitates engagement of all of the terminals with all of the contacts on the testing device, even if the terminals are not precisely coplanar with one another.

The terminals of a chip package may be in the form of generally flat pads. Small solder balls may be deposited on these pads so that the package may be bonded to a circuit panel by aligning the solder balls with corresponding contact pads of a circuit panel and melting the solder balls in a conventional operation of the type commonly used for surface mounting of components to circuit boards.

As disclosed in U.S. Patent Publication Nos. 2005/0181544; 2005/0181655; and 2005/0173805, the disclosures of which are hereby incorporated by reference herein, as well as in U.S. Pat. No. 6,774,317, the disclosure of which is also incorporated by reference herein, a chip or other microelectronic element may be provided with terminals in the form of posts, and such posts may be bonded to a circuit panel in a similar soldering operation. In certain embodiments, the posts can provide particularly good engagement with test fixtures during testing before mounting to the circuit panel.

Semiconductor chip packages most commonly have been made by assembling individual chips with the other elements constituting the package. This requires handling and placement of the "bare" or unpackaged semiconductor chips. Various proposals have been advanced for making chip packages in a wafer-scale operation, as by uniting the wafer with the other elements of the packaged chip before severing the wafer to form individual chips. For example, the aforementioned '977 patent discloses certain embodiments of processes which form the chip packages in this manner.

Some processes for making packaged chips on a wafer scale have suffered from certain drawbacks. Where a compliant layer is formed on the front surface of a wafer, as, for example, by depositing a curable material and then curing the material to form the layer, the compliant layer tends to cause warpage of the wafer. Such warpage may occur, for example, due to differential expansion and contraction of the compliant material and the semiconductor material constituting the wafer during curing of the compliant material or during other processing operations. Such warpage makes it difficult to perform other processing operations such as forming the terminals and the connections between the terminals and the contacts. While such warpage can be reduced by reducing the thickness of the compliant layer, a thin compliant layer may not provide sufficient movability to the terminals.

As disclosed, for example, in U.S. Pat. No. 6,847,101, the disclosure of which is hereby incorporated by reference herein, a compliant layer may include individual elements in the form of protrusions projecting from the surface of the chip or wafer, with the terminals being disposed at the tops of such protrusions and with electrical connections between the terminals and the contacts including metallic strips extending downwardly from the tops of such protrusions towards the front surface of the chip or wafer. Such individual bumps or protrusions can provide significant compliance without the drawbacks associated with a continuous layer.

It has been proposed to fabricate compliant layers incorporating such individual bumps or protrusions by applying individual drops or masses of an uncured dielectric material onto the front surface of a wafer as, for example, by silk screening the uncured compliant material onto the front surface. Considerable care must be exercised in such a process to avoid contaminating the contacts of the wafer with the dielectric material. Moreover, the bumps formed in this fashion tend to have uneven heights. The uneven heights of the bumps result in terminals having uneven height. This makes it more difficult to engage all of the terminals simultaneously with a test fixture.

It is typically desirable to apply a solder mask layer over the metallic strips. It is desirable to have the solder mask extend up the sides of the protrusions to the vicinity of the terminals. The solder mask serves to limit the spread of solder along the metallic strips during a surface-mounting operation used to mount the packaged chip to a circuit panel after testing. Some attempts to form such solder masks on bumps have resulted in the solder mask projecting above the height of the terminal. Thus, although a hole in the solder mask allows soldering to the terminal, the terminal is recessed relative to the solder mask and therefore cannot be readily engaged with a flat contact pad on a test fixture prior to soldering. This effect can be avoided by terminating the solder mask at a height well below the height of the terminal. However, this allows the solder to spread along at a substantial part of each metallic strip, which, in turn, can cause fracture of the strips during service.

SUMMARY OF THE INVENTION

One aspect of the present invention provides methods of making chip assemblies. A method according to this aspect of the invention desirably includes the step of forming a dielectric structure so that a first surface of the dielectric structure is shaped by a working surface of a mold. The method desirably also includes the step of transferring the dielectric structure onto a surface of a wafer element including one or more chip regions so that the first surface of the dielectric structure faces away from the wafer element and a second surface of the dielectric structure faces toward the wafer element. The method may also include the steps of providing terminals on the first surface of the dielectric structure; and electrically connecting the terminals to contacts of the wafer element.

A further aspect of the invention provides a microelectronic element. The element according to this aspect of the invention includes a body and terminals carried on the body. Each terminal includes an electrically conductive pad and an electrically conductive post on the pad projecting upwardly away from the body. The microelectronic element may further include a solder mask on the body, the solder mask having apertures aligned with the pads so that the pads are exposed through said apertures. Preferably, the posts project above the solder mask.

Yet another aspect of the invention provides a method of testing a microelectronic element including a body and terminals carried on said body, each terminal including an electrically conductive pad and an electrically conductive post on the pad projecting upwardly away from the body. The method according to this aspect of the invention desirably includes engaging the microelectronic element with a test fixture so that the posts of the terminals abut contact pads of the test fixture. The engaging step may include urging the microelectronic element and test fixture toward one another, and at least some of the posts may be deformed during the engaging step.

DETAILED DESCRIPTION

Figure 1:
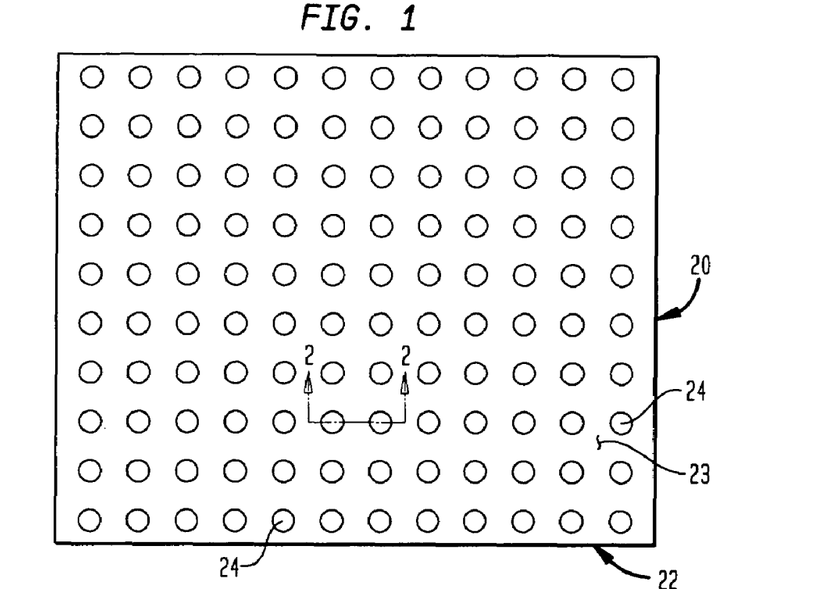
FIG. 1 is a diagrammatic plan view of a mold utilized in a process according to one embodiment of the invention.
Figure 2:
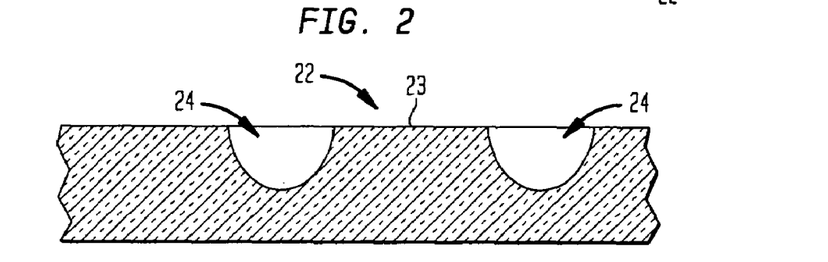
FIG. 2 is a fragmentary sectional view taken along line 2-2 in FIG. 1.

A process in accordance with one embodiment of the invention utilizes a mold 20 (FIGS. 1 and 2) having a working surface 22 incorporating a flat land region 23 and plurality of depressions 24 extending into the mold from the land region. Depressions 24 are depicted in FIG. 1 as disposed on a rectilinear grid pattern, but the depressions can be placed in any desired pattern to form any desired pattern of bumps. Desirably, mold 20 is formed from a material such as glass having a coefficient of thermal expansion close to the coefficient of thermal expansion of the wafer element used in a later stage of the process. Typically, the wafer element is formed predominantly from silicon and has a coefficient of thermal expansion of about $3.0 \times 10^{-6}/°$ C. Therefore, the mold desirably has a coefficient of thermal expansion between about 0 and about $6 \times 10^{-6}/°$ C. Depressions 24 have a height approximating the height of the desired bumps or protrusions in the dielectric structure to be formed as, for example, about 50 to about 200 microns. The mold desirably has smooth surfaces and has a surface resistant to bonding with the dielectric material to be used. For example, the mold may have a coating (not shown) of a release agent compatible with the dielectric.

Figure 3:
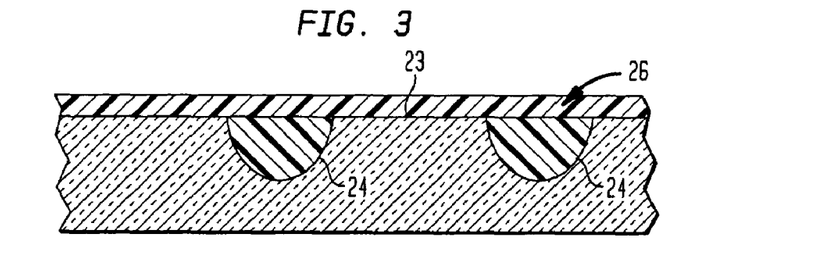
FIGS. 3 and 4 are views similar to FIG. 2, but depicting a mold during later stages of a process.

In the next stage of the process (FIG. 3), an uncured dielectric material 26 is deposited on the working surface 22 of the mold so that the dielectric covers the working surface and fills the depressions 24 of the working surface. The dielectric may be applied by any suitable method. For example, the dielectric may be deposited using a squeegee or roller, or may be spin-coated. In spin-coating, the flowable material is deposited onto the working surface and distributed over the working surface by rapidly rotating the mold around an axis normal to the working surface, so that centrifugal forces cause the dielectric to spread. Spin-coating per se is a known process normally used to apply dielectrics on the surfaces of semiconductor wafers. In a further variant, the dielectric may be deposited as a preformed sheet and brought to a flowable condition as, for example, by heating it. Any suitable method can be employed, so long as the dielectric enters into cavities 24 so that the dielectric assumes the shape of the cavities 24.

Figure 4:
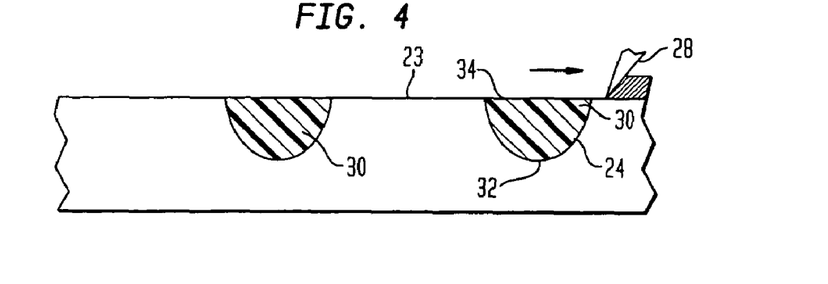

After application of the dielectric, but while the dielectric is still in a flowable condition, excess dielectric is removed from the land region 23 as, for example, by moving a squeegee 28 across the land region while holding the squeegee tightly against the mold. The dielectric is a dielectric structure in the form of a layer of individual, isolated bumps 30 occupying the depressions. The bumps have first surfaces 32, facing downwardly as seen in FIG. 4, which are shaped by the working surface and specifically by those portions of the working surface defining the depressions. The bumps have second surfaces 34 facing upwardly as seen in FIG. 4.

Figure 5:
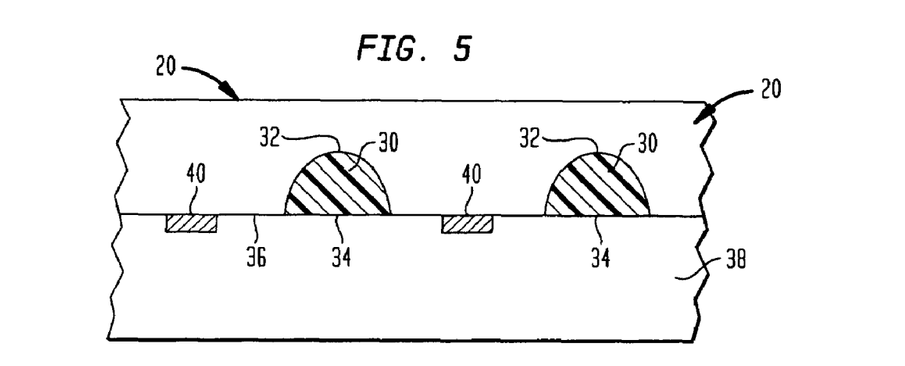
FIG. 5 is a fragmentary sectional view depicting the mold of FIGS. 1-4 in conjunction with a wafer element.

In the next stage of the process, the mold 20 with the layer of bumps 30 thereon is placed over the front surface 36 of a wafer element 38 having contacts 40 exposed at the front surface 36. The wafer has contacts 40 exposed at the front surface 36. The wafer element used in the process may include an entire unitary semiconductor wafer incorporating numerous chip regions, each such chip region incorporating the electronic components of a single semiconductor chip. In such a unitary wafer, the chip regions are separated by at severance planes or saw lanes (not shown). Alternatively, the wafer element may be a unitary portion of such a wafer including numerous chips; a single chip; or an array of multiple individual chips mechanically held on a temporary carrier or otherwise mechanically connected to one another to form an array. The mold 20 and the layer of bumps 30 are placed so that the first surfaces 32 of the bumps, which constitute the first surface of the dielectric structure, face away from the wafer element 36; whereas the second surfaces 34 of the bumps, constituting the second surface of the dielectric structure, face toward the wafer element and contact the front surface 36 of the wafer element. The second surface of the dielectric structure constituted by the second surfaces 34 of the individual bumps is bonded to the front surface 36 of the wafer element. For example, the dielectric material may be only partially cured at the time the mold is placed over the wafer element, so that completion of the curing process causes the dielectric itself to adhere to the front surface 36 of the wafer element. Alternatively or additionally, a coating of a separate adhesive material may be applied on the wafer element or on the second surface of the dielectric structure constituted by bump second surfaces 34, so that the adhesive layer lies between the second surface of the dielectric structure and the front surface of the wafer element when the mold is placed over the wafer element. The mold maintains the bumps at precise spacings relative to one another, so that each bump can be positioned at the desired location on the front surface of the wafer element. The closely matched coefficient of thermal expansion of the mold and the material constituting the wafer element facilitates such precise positioning. The mold can be positioned relative to the wafer element using conventional techniques such as robotic vision systems. Typically, the wafer element includes marks, commonly referred to as fiducial marks, to aid the process of registering the mold with the wafer element. After the second surface 34 of the dielectric structure has been bonded to the front surface 36 of the wafer element 38, the mold is removed, leaving the dielectric structure or bumps 30 in place.

The dielectric material is cured to a solid or substantially solid condition before the mold is removed. The curing process may occur before or after the mold is placed over the wafer element, or both before and after placement. The curing process will depend upon the composition of the dielectric. If the dielectric is a thermoplastic, curing may occur upon cooling of the dielectric. Other dielectrics such as certain silicone polymers cure by chemical reaction which may be promoted by heating. Still other dielectric materials can be cured by radiant energy such as ultraviolet light.

The dielectric material desirably is selected so that, when cured to a solid or substantially solid condition, the dielectric material has appreciable compliance. The degree of compliance will depend not only on the properties of the material, but also on the physical configuration of the dielectric layer or bumps. Also, the degree of compliance will depend upon the relationship between the temperature of the layer and the properties of the material. For example, certain polymers soften appreciably at and above their glass transition temperatures. Therefore, a wide variety of dielectric materials can be employed. However, for many typical applications, silicones such as Dow Corning 5010 may be employed.

Figure 6:
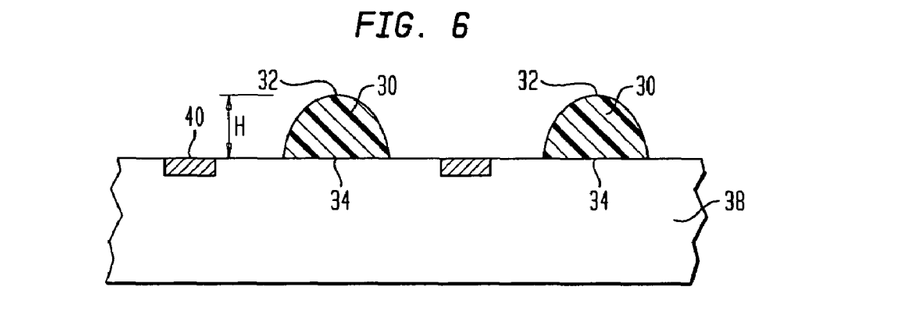
FIGS. 6 and 7 are fragmentary sectional views depicting the wafer element of FIG. 5 at later stages of the process.

Because the bumps are formed in engagement with the mold, all of the bumps have a precise height and shape. In particular, the height H of each bump above the front surface 36 of the wafer is precisely controlled. Most typically, the height H of all of the bumps is the same.

Figure 7:
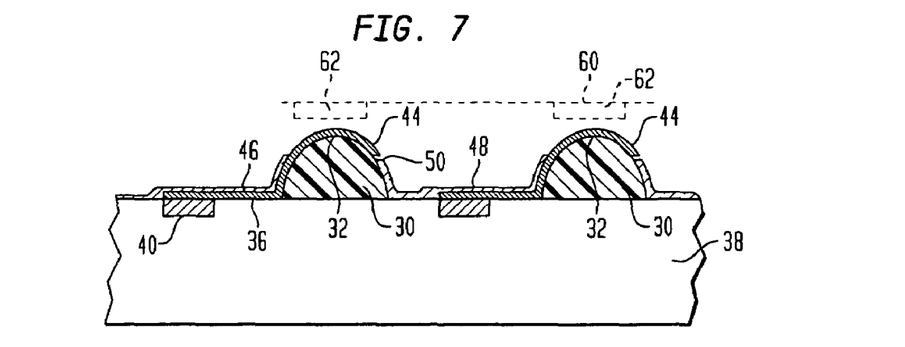
Figure 8:
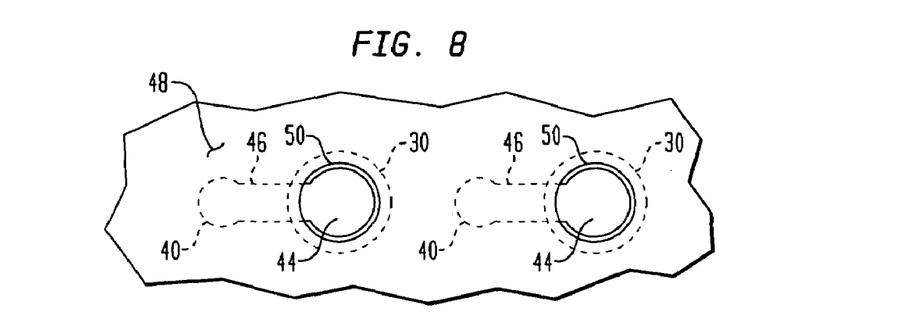
FIG. 8 is a fragmentary, diagrammatic plan view depicting a portion of the wafer element shown in FIG. 7.

After removal of the mold from the front surface of the wafer element, metallic terminals 44 are formed on the first surface of the dielectric structure, i.e., on the first surfaces 32 of the bumps (FIGS. 7 and 8). The terminals are connected to the contacts 40 of the wafer element by forming electrically conductive strips 46 extending from the terminals along the surfaces of the bumps to the front surface 36 of the wafer element, and extending along the front surface 36 of the wafer element to the contacts. The metallic terminals and strips may be formed by selectively depositing a metal on the wafer element and bumps, or by non-selectively depositing a metal over the wafer element and bumps to form a continuous metallic layer extending over all of the bumps and the front surface of the wafer element and then etching the continuous metallic layer to form individual terminals and strips. In the particular arrangement illustrated, each terminal 44 is connected to only one contact 40 of the wafer element. However, more complex arrangements, wherein the strips interconnect multiple contacts or terminals with one another can also be employed.

Following formation of the terminals and strips, a solder mask layer 48 is deposited over the front surface of the wafer element. The solder mask layer has apertures 50 aligned with terminals 44, so that the terminals are exposed through the apertures 50. The solder mask layer may be a photoimageable material, such as a photoimageable dielectric polymer, which is applied in an uncured condition and then selectively cured by selectively exposing the material to radiant energy such as ultraviolet light. Following such selective curing, the uncured portions of the layer are removed as, for example, by washing.

If the wafer element includes plural chips, the wafer element can be severed before or, more typically, after formation of the terminals and solder mask layer. Most typically, where the wafer element is a unitary element, severance is accomplished by cutting the wafer along saw lanes, so as to form individual units, each unit including one or more chip regions, and the portions of the dielectric structure overlying such region or regions.

The resulting units can be handled and packaged like standard packaged chips. The units can be tested by engaging them with a test fixture 60, portions of which are depicted in FIG. 7. The test fixture has numerous contact pads 62 arranged in an array corresponding to the arrangement of terminals 44. A unit is urged toward the test fixture, so as to bring the terminals 44 into engagement with the contact pads 62. During such engagement, bumps 30 can deform to allow some vertical movement of the terminals 44, i.e., movement of individual terminals toward the front surface 36 of the chip.

Thus, if a particular terminal is slightly above the level of the other terminals, the associated bump 30 can deform to a slightly greater degree than the other bumps, so that all of the terminals can be brought into engagement with all of the contact pads. In a similar manner, the bumps can deform to different degrees to compensate for non-planarity of the contact pads 62 on the test fixture. The precise height of the bumps and the resulting substantial co-planarity of the terminals reduces the amount of bumps deformation required to assure that all of the terminals are engaged with all of the contact pads on the test fixture.

After testing, the unit can be bonded to a substrate such as circuit panel by bonding terminals 44 to contact pads of a circuit panel (not shown) using a solder or other electrically conductive bonding material. The bumps can deform to compensate for differential thermal expansion of the chip and the substrate. Stated another way, as the chip and substrate expand and contract by different amounts, the terminals 44 tend to move along with the contact pads of the substrate, and therefore tend to move relative to the chip and relative to contacts 40. Deformation of the bumps allows such movement, and thus provides at least partial compensation for differential thermal expansion. Such compensation desirably is sufficient to substantially reduce or eliminate stress on the bonding material connecting the terminals to the substrate. This, in turn, minimizes the probability of fatigue failure of the bonding material.

Figure 9:
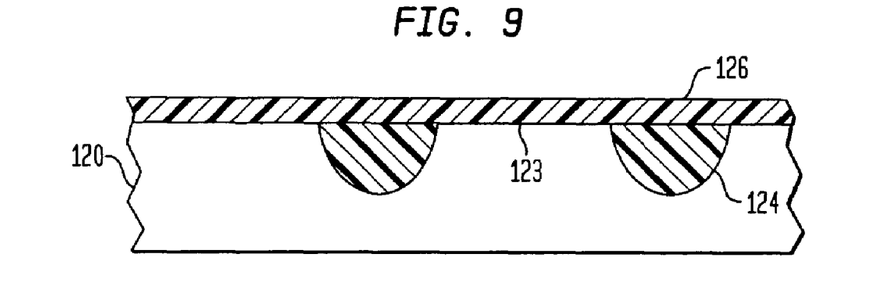
FIGS. 9 and 10 are fragmentary sectional views depicting a mold and molded elements according to stages of a process in accordance with a further embodiment of the invention.

A process in accordance with a further embodiment of the invention uses a mold 120 (FIG. 9) similar to the mold 20 discussed above. Here again, the dielectric material 126 is applied over both the depressions 124 and the land areas 123 of the mold working surface. In this embodiment, however, the dielectric material on the land areas is not removed in its entirety. Instead, the dielectric material on the land areas remains in place so as to form a substantially continuous flat layer element 101 (FIG. 10), mechanically interconnecting the bumps 130 formed in the cavities 124. Thus, in this embodiment, the dielectric structure includes both layer element 101 and the bumps; the first surface 132 of the dielectric structure includes both the surfaces of the bumps formed by the surfaces of depressions 124 and the surface of layer element 101 formed by contact with the land areas 123 of the mold. The second surface 134 of the dielectric structure is defined by the surface of layer element 101 facing away from the mold. Most preferably, the processes used to apply the dielectric material are selected so that the thickness of layer element 101 is substantially uniform. For example, a spin coating process tends to provide a substantially uniform thickness. Alternatively or additionally, an element such as a plate (not shown) may be brought into contact with the second surface 134 before completion of the curing step.

Figure 10:
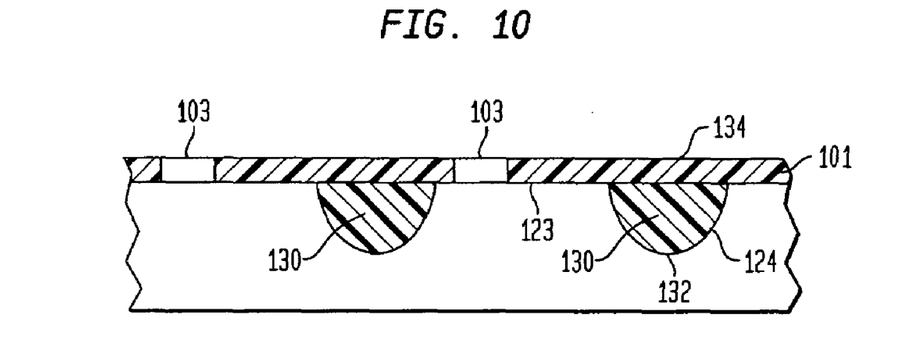

Openings 103 are formed through layer element 101. Such openings may be formed by any suitable process. For example, where the dielectric material 126 is a selectively curable, photoimageable dielectric, the dielectric material may be selectively exposed to light so as to leave regions corresponding to openings 103 uncured while curing the remainder of the dielectric, and the uncured portions may be removed by washing the structure. In a further variant, openings 103 may be formed by ablating or punching layer 101 as, for example, by laser-ablating the structure while the structure remains in mold 120. In a further variant, mold 120 may be provided with pins projecting from land regions 123. In yet another variant, a plate used to form second surface 134 may be provided with such pins, and such pins may either abut the land regions 123 or enter into holes (not shown) in the mold 120.

Figure 11:
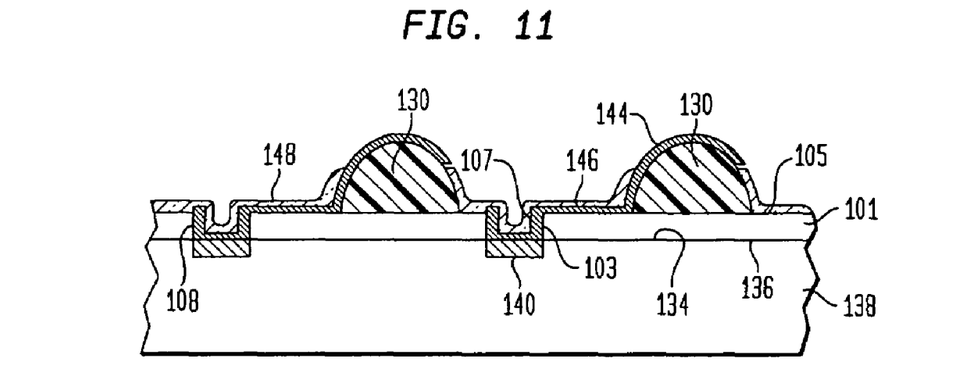
FIG. 11 is a fragmentary sectional view depicting a portion of a packaged chip formed in the process of FIGS. 9 and 10.

In this embodiment as well, the mold is placed over a wafer element 138 (FIG. 11), so that the second surface 134 of the dielectric structure confronts the front surface 136 of the wafer element 138 (FIG. 11). Openings 103 desirably are aligned with the contacts 140 of the wafer element. Here again, the mold helps to position the bumps 130 and precisely register the bumps with the contacts on the wafer. The mold also facilitates registration of the openings 103 with the contacts. The openings provide a path for air or other trapped gases to escape from between the layer element 101 and the front surface of the wafer element. In this embodiment as well, after transfer of the dielectric structure and removal of the mold, terminals 144 and connecting strips 146 are formed from an electrically conductive material in the same way as discussed above. The connecting strips in this embodiment extend along a surface 105 of the layer element 101, facing away from wafer element 138, constituting a part of the second surface of the dielectric structure. The strips extend into openings 103 and form via liners 107 in these openings which electrically connect the strips with contacts 140. Once again, a solder mask layer 148 desirably is applied on the structure after formation of the strips and terminals. In other respects, this embodiment is similar to the embodiments discussed above with reference to FIGS. 1-8.

A process according to yet another embodiment of the invention uses a mold 220 (FIG. 12) having depressions 224 and land areas 223 therebetween. Each depression 224 defines a major surface 201 and sloping side surfaces 203 connecting the major surface with the land regions. Each depression also includes a post-forming portion 205 projecting downwardly into the mold from major surface 201. As in the embodiments discussed above, a dielectric material 226 (FIG. 13) is introduced into the depressions. The dielectric material forms bumps 230. Each bump 230 has an apex or pad region 206 corresponding to the main surface 201 of the depression, as well as a post 207 projecting from the pad region. Posts 207 are considerably smaller in diameter than bumps 230, and considerably smaller than the pad regions 208 of the bumps. For example, posts 207 may be on the order of 25-150 microns in diameter and on the order of 25-75 microns high. The second surface 234 of each bump is generally flat. Each bump also has a sloping side wall surface 209 corresponding to the sloping wall surface 203 of the depression which formed the bump.

Figure 14:
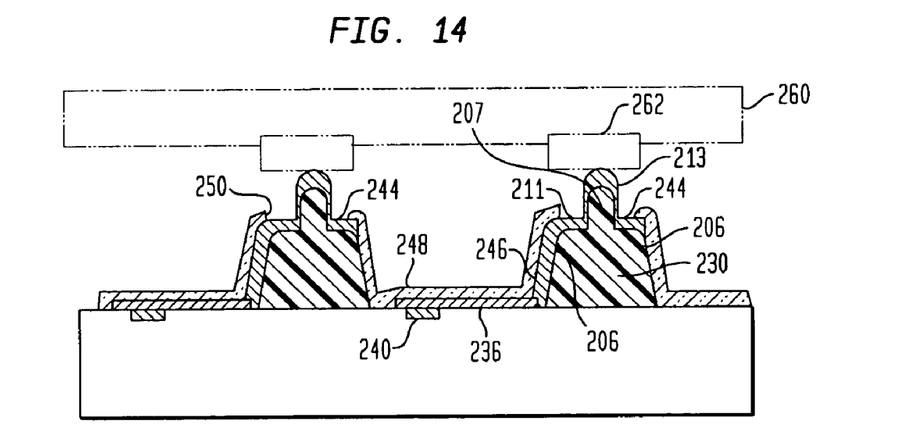
FIG. 14 is a fragmentary sectional view depicting a portion of a packaged chip formed using the molded element of FIG. 13.

In this embodiment as well, after transfer of the dielectric structure or bumps 230, conductive terminals 244 (FIG. 14) are formed on the bumps. Each conductive terminal includes a pad 211 overlying the pad region 206 of the bump, as well as a post 213 projecting from pad 211. The metallic posts 213 are only slightly larger in diameter and height than posts 207 formed as parts of the bumps. Thus, the metallic posts 213 have dimensions and aspect ratios as discussed above with reference to posts 207. In this embodiment as well, conductive strips 246 connect pads 211 of terminals 244 with the contacts 240 of the wafer element. Strips 246 extend along the sloping side walls 209 of the bumps 230, and extend along the front surface 236 of the wafer element to the contacts 240. In this embodiment as well, a solder mask layer 248 is deposited over the strips and other elements. The assembly thus includes a body incorporating the chip and the dielectric structure or bumps, the terminals being carried on the body. Here again, the solder mask layer is provided with apertures 250 aligned with terminals 244. As best seen in FIG. 14, the solder mask layer in this embodiment may extend up the posts to the pad regions 206 of the posts, and extend onto the exposed surfaces of pads 211 of the terminals. However, the conductive posts 213 formed on dielectric posts 207 project upwardly beyond the solder mask layer 248.

The assembly can be tested by engaging the terminals 244 with contact pads 262 of a test fixture. The projecting posts 213 assure that the posts can be engaged despite the presence of solder mask layer 248. Forces applied between the contact pads 262 and the terminals are concentrated in the posts and in those portions of the bumps 230 disposed beneath the posts. Thus, forces applied through the posts will tend to cause localized deformation of the material in the bumps beneath the posts. For all of these reasons, the tips of the posts can be displaced readily toward the chip or wafer element 238 using relatively small forces. This facilitates engagement of all of the post tips on all of the contacts with all of the contact pads. Stated another way, structures having such posts provide good compensation for non-planarity and allow engagement of the chip with the test fixtures using relatively small forces. Additionally, the tips of the posts may tilt and wipe across the surfaces of the contact pads.

Figure 15:
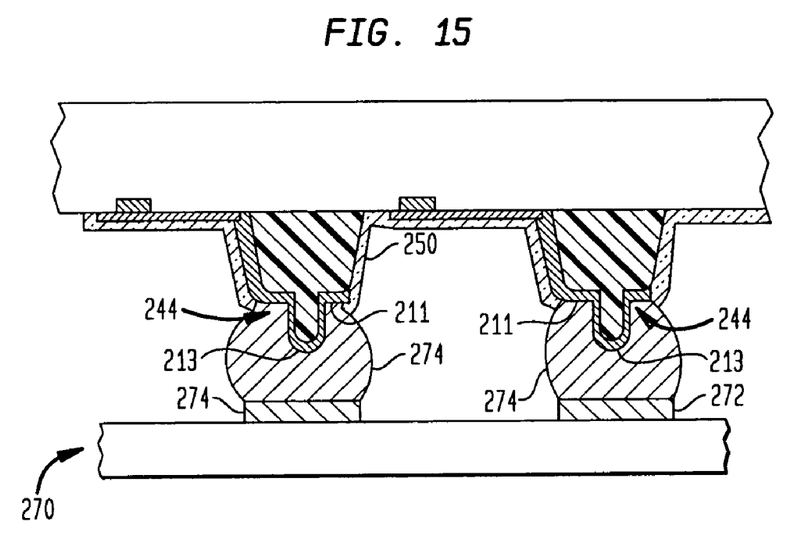
FIG. 15 is a fragmentary sectional view depicting the packaged chip of FIG. 14 in conjunction with a circuit panel.

After testing, the packaged chip is solder-bonded to a substrate 270 (FIG. 15). As discussed above, the terminals 244 are bonded to the contact pads 272 of the substrate. The solder bonds may be formed by applying solder to the terminals or to the contact pads before placing the terminals in alignment with the contact pads and then reflowing the solder. The solder 274 spreads out over the pad region 211 of each terminal until the solder reaches the solder mask layer 250. Thus, the full exposed area of the pad is bonded to the solder to provide a full-strength joint. The posts 213 are effectively immersed in the solder and encased within the solder. The posts do not detract from the strength of the solder joint, and in fact, may act as reinforcement within the solder joint.

Figure 16:
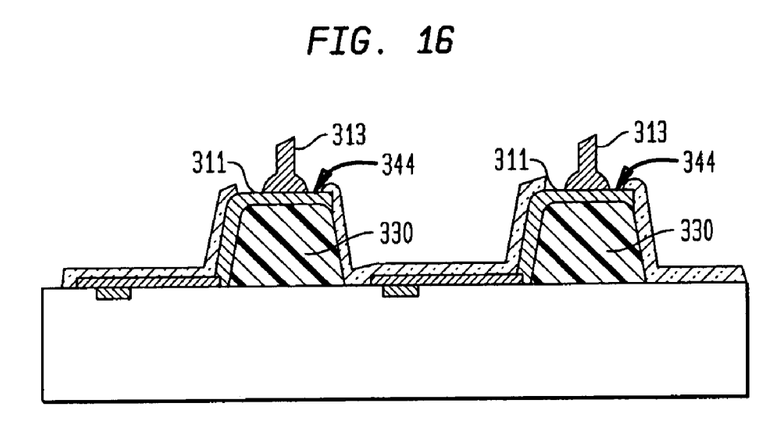
FIG. 16 is a view similar to FIG. 14, but depicting portions of a packaged chip in accordance with a further embodiment of the invention.

A packaged chip according to a further embodiment of the invention (FIG. 16) includes a dielectric structure with bumps 330 similar to the bumps of FIG. 15, but without the dielectric posts 207 discussed above with reference to FIGS. 12-15. Here again, each terminal 344 has a pad region 311. Conductive posts 313 are provided on the pad regions by attaching a separate metallic element. Such attachment may be performed by wire-bonding. In wire-bonding, a fine wire is ultrasonically or thermosonically bonded to a metallic structure such as the pad region 311 and then severed to form a post. Posts 313 perform substantially the same functions as posts 213 discussed above with reference to FIGS. 14 and 15. The attachments between the posts 313 and the underlying pad regions 311 of the terminals need not be particularly strong or fatigue-resistant. As discussed above, the posts are immersed within the solder masses formed when the assembly is solder-bonded to a circuit panel or other substrate.

Bumps with posts as discussed with reference to FIGS. 12-16 may be provided in conjunction with a layer element such as the layer element 101 discussed above with reference to FIGS. 9-11.

Figure 17:
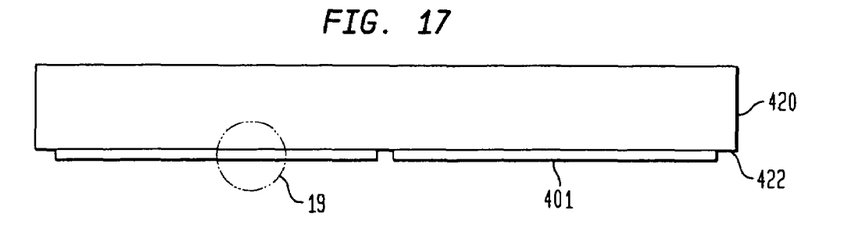
FIG. 17 is a diagrammatic elevational view depicting a mold and molded article in accordance with a still further embodiment of the invention.
Figure 18:
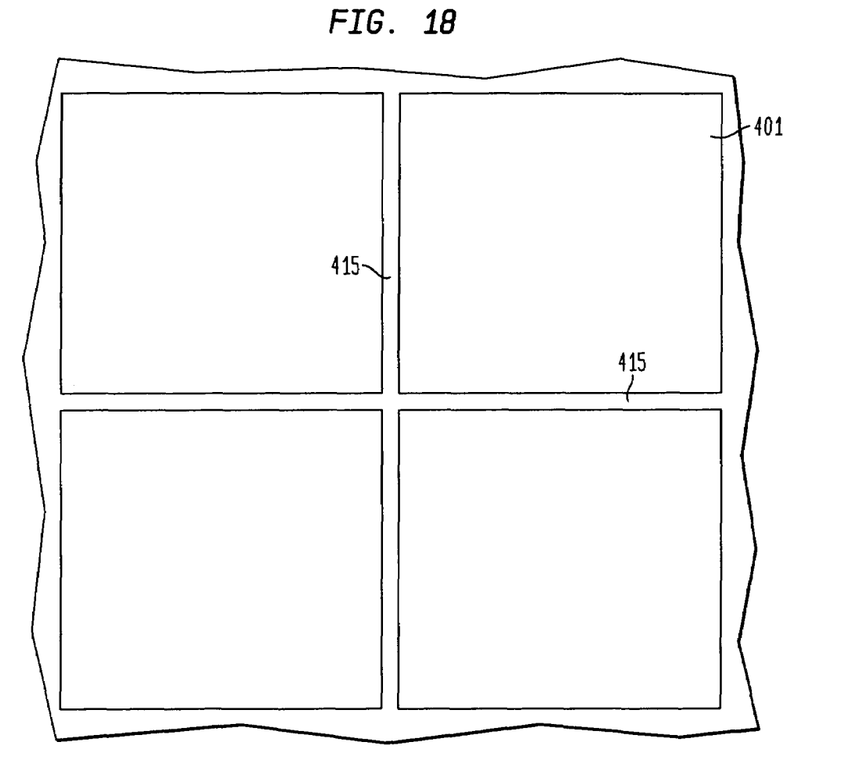
FIG. 18 is a diagrammatic plan view of the mold and molded layer shown in FIG. 17.
Figure 19:
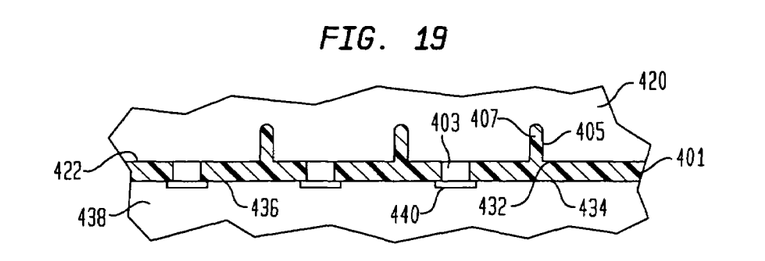
FIG. 19 is a fragmentary sectional view of the area indicated at 19 in FIG. 17.

A method according to yet another embodiment of the invention utilizes a generally flat mold 420 (FIG. 17) having a working surface 422 to form a dielectric structure including a generally planar layer element 401 having a first surface 432 formed by contact with the mold working surface 422, and having a second surface 434 facing away from the mold. As best seen in FIG. 19, mold 420 has small pits 405 comparable to the post-forming regions 205 discussed above with reference to FIG. 12. These pits form posts 407, which may have dimensions comparable to those discussed above with reference to posts 207. Posts 407 project from the planar first surface of layer element 401. As best seen in FIG. 18, the generally planar layer element 401 has gaps 415. Gaps 415 are provided in a pattern corresponding to the pattern of saw lanes in the wafer element. As best seen in FIG. 19, layer element 401 also has openings 403 extending through it from first surface 432 to second surface 434. The openings 403 and gaps 415 may be formed in any of the ways discussed above with reference to openings 103 (FIGS. 9-11).

Figure 20:
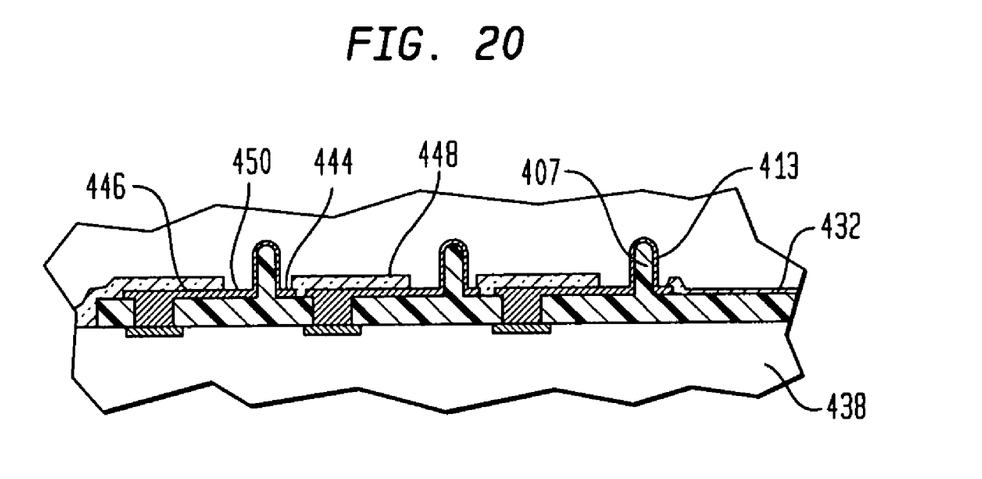
FIG. 20 is a fragmentary sectional view depicting a portion of a packaged chip made using the molded article of FIGS. 17-19.
Figure 21:
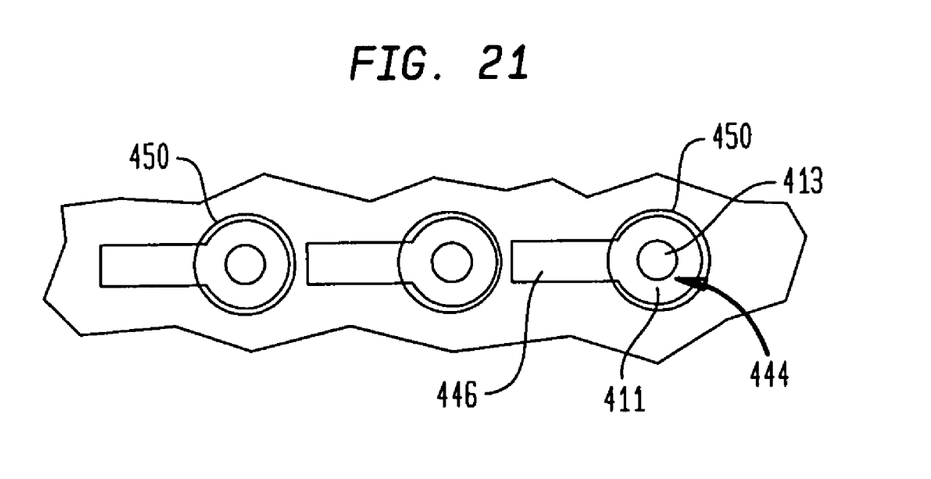
FIG. 21 is a fragmentary plan view of the packaged chip shown in FIG. 20.

In this embodiment as well, the dielectric structure is applied to a wafer element 438 by engaging the mold with the wafer element so that the second surface 434 of the dielectric structure faces the front surface 436 of the wafer element. Here again, openings 403 are aligned with the contacts 440 of the wafer element. After removal of the mold, leaving the dielectric structure in place, terminals 444 and connecting strips are formed on the first surface 432 of the dielectric layer (FIG. 20). In this embodiment as well, conductive, metallic posts are formed by depositing metal onto the posts 407 of the dielectric layer. As best seen in FIG. 21, each terminal 444 includes a pad region 411 surrounding a post 413. Here again, a solder mask 448 is applied over the strips and over the first surface of the dielectric structure, leaving openings 450 aligned with the terminals. As best seen in FIG. 20, the posts 413 project upwardly above the solder mask so that the solder mask does not interfere with engagement between the terminals and a test fixture.

Here again, the wafer element is severed along saw lanes. Because gaps 415 (FIG. 18) are aligned with the saw lanes, there is no need to sever the dielectric structure along with the wafer. This simplifies the task of severing or "dicing" the wafer element. Gaps 415 also provide additional paths for escape of air or other trapped gases during assembly of the dielectric structure to the wafer element.

The resulting packaged chip may be tested by engaging it with a test fixture in the manner discussed above. Because there are no bumps or projections such as those discussed above, the dielectric structure may be less compliant in the vertical direction towards and away from the chip or wafer unit 438 than the structures discussed above. However, in this embodiment as well, the posts can be crushed or otherwise deformed to provide good engagement with the contact pads of a test fixture. In this embodiment as well, the terminals can be solder-bonded to contact pads of a circuit panel or other substrate. Here again, the solder bond surrounds the posts which may have been crushed or otherwise deformed during the testing procedure. The posts do not interfere with production of a strong, large area bond between the solder mass and the terminal. In a variant of the structure discussed with reference to FIGS. 17-21, the posts may be wire-bonded or otherwise assembled to the pad regions of the terminals in the manner discussed above with reference to FIG. 16.

Figure 22:
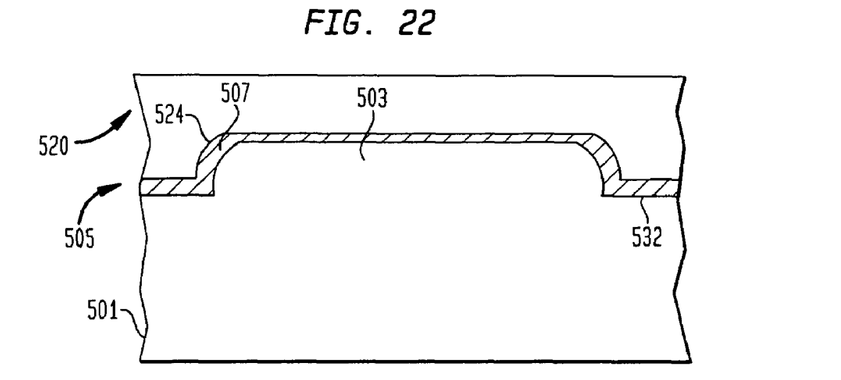
FIG. 22 is a fragmentary sectional view depicting portions of a mold during a molding process according to a further embodiment of the invention.
Figure 23:
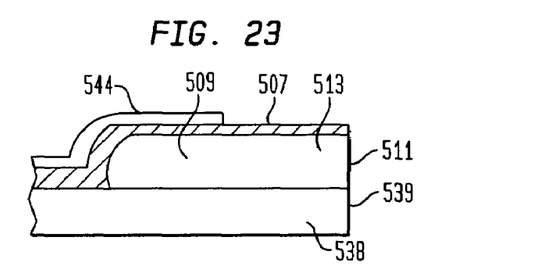
FIG. 23 is a fragmentary sectional view depicting a portion of a packaged chip made using the article molded in the process of FIG. 22.

As disclosed in the co-pending, commonly assigned U.S. patent application Ser. No. 11/318,815, filed Dec. 27, 2005, the disclosure of which is incorporated by reference herein, compliant bumps may include gas-filled spaces, and such spaces may be connected to vents extending to the exterior of the packaged chip. As seen in FIG. 22, mold 520, having a working surface with a depression 524, may be used in conjunction with a further mold element 501 having a projection 503 to form a compliant layer 505 having a bump or projection 507 with a hollow space in the area occupied by projection 503 of mold element 501. In the particular configuration illustrated, depression 524 and projection 503 are elongated elements, so that bump 507 is formed as an elongated structure having a cavity 509 (FIG. 23) and a passageway 513 communicating with cavity 509. After removal of mold element 501, the second surface 532 of the compliant structure is placed onto a wafer element as by placing mold 520 over the front surface with the compliant layer 505 thereon. The passageways 513 extend across severance planes of the wafer element. Terminals 544 are formed on the bumps over the cavities 509 as shown, for example, in FIG. 23. When the wafer element is severed, elongated bumps 507 are cut at the severance plane so as to form vents 511 at the edges 539 of the packaged chip. The vents 511 communicate with cavities 509 through passageways 513. As disclosed in the aforesaid co-pending application, other measures can be employed to form the vents. The hollow bumps 507 with cavities 509 therein provide a highly compliant structure. The vents maintain the gas pressure inside cavities 509 in equilibrium with atmospheric pressure prevailing outside of the structure.

Figure 24:
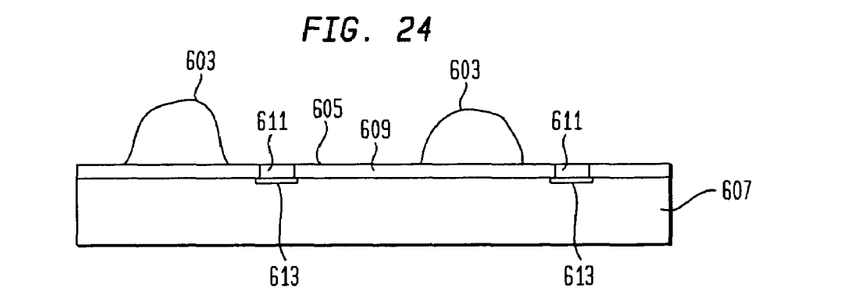
FIG. 24 is a diagrammatic elevational view depicting elements used in a process according to a further embodiment of the invention.

In a method according to yet another embodiment of the invention, a compliant structure including a set of bumps is formed by depositing masses 603 (FIG. 24) of a flowable or deformable dielectric material 603 onto a font surface 605 of a wafer 607. The front surface of the wafer in the embodiment depicted is defined by dielectric passivation layer 609 formed from a material such as silicon oxides, silicon nitrides, or polymeric dielectrics such as polyimide. The wafer has contacts 613 which are exposed to the front surface 605 by openings 611 in the passivation layer. The contacts are connected to the internal electrical components (not shown) of the wafer. Masses 603 may be deposited by any convenient method, including silk screening of a flowable dielectric material. At this stage of the process, the masses typically will be of uneven height above front surface 605.

Figure 25:
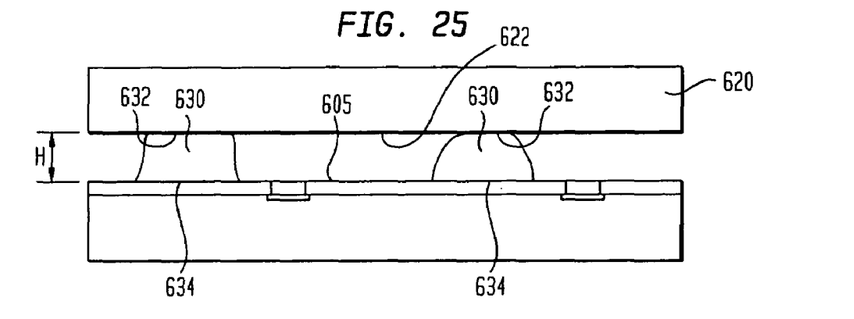
FIGS. 25 and 26 are further diagrammatic elevational views depicting the elements of FIG. 24 at later stages in the process.
Figure 26:
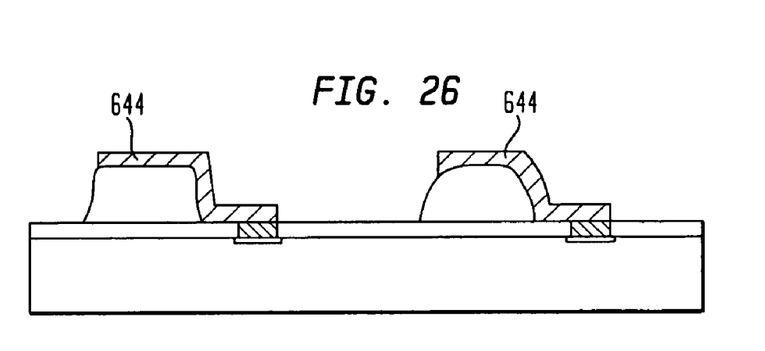

After depositing the masses on the wafer, the wafer is brought to a preselected disposition relative to a mold 620 (FIG. 25). Mold 620 in this embodiment is simply a plate having a flat working surface 622 which desirably is resistant to wetting by the flowable dielectric in masses 603 and resistant to adhesion by the dielectric. For example, the working surface of the mold may be a very smooth glass surface, with a coating of a mold release agent such as a fluoropolymer. Here again, the first surface 632 of each mass of compliant material is formed by contact with the working surface of the mold. The second surface 634 of each mass is formed in contact with the wafer surface. The masses 603 are at least partially cured to form a set of bumps 630 similar to the bumps of the dielectric structure discussed above with reference to FIGS. 1-8. Here again, the bumps all have precisely controlled height H. After the bumps are at least partially cured, the mold 620 is removed, thereby transferring the formed dielectric structure to the wafer and leaving the dielectric structure including bumps 630 in place on the wafer. Following removal of the mold, the metallic features such as terminals 644 (FIG. 26) are formed on the first surface of the dielectric structure. A solder mask layer (not shown) may be applied, and the wafer may be severed to form individual units in the same manner as discussed above.

Figure 12:
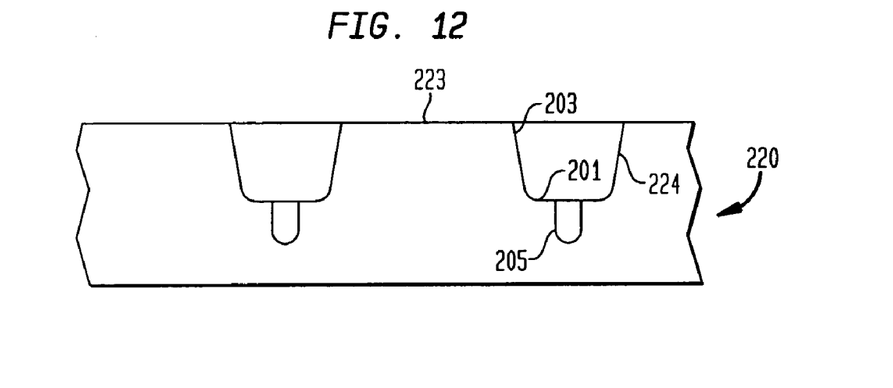
FIG. 12 is a fragmentary sectional view depicting a mold used in a process used according to a further embodiment of the invention.
Figure 13:
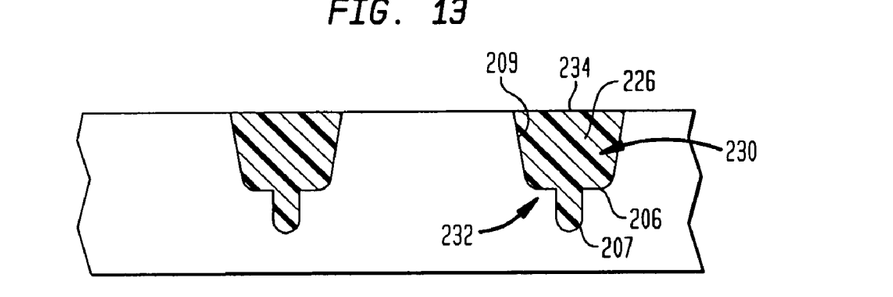
FIG. 13 is a view similar to FIG. 12, but depicting a mold in conjunction with molded elements at a later stage of the process.

In a variant of this process, mold 620 is not flat but instead is provided with post-forming regions similar to the post-forming regions 207 shown in FIG. 12, so as to form posts on the first surfaces of the various bumps 630. In a further variant, the bumps are formed by applying the flowable dielectric masses to an intermediate structure rather than to the wafer front surface, and curing the masses to form the bumps between the intermediate structure and the mold. The dielectric structure including the bumps may be released from the mold and intermediate structure and transferred to the wafer front surface. Alternatively, the bumps may be released from the mold and transferred together with the intermediate structure to the wafer front surface. For example, the intermediate structure may be a dielectric layer and the bumps may adhere permanently to this dielectric layer when cured.

Numerous variations and combinations of the features discussed above can be employed. In one such variant, a dielectric structure as, for example, a cohesive dielectric structure which includes a layer element such as that described above with reference to FIGS. 9-11 can be transferred from the mold to the wafer element by removing the dielectric structure from the mold and then placing the dielectric structure onto the wafer element. Alternatively or additionally, the dielectric structure may be transferred from the mold onto an intermediate carrier which may hold the various elements of the dielectric structure in position relative to one another and then transferred from the intermediate structure to the wafer element. Such an intermediate structure can be used with a dielectric structure having separated elements as, for example, isolated bumps as discussed with reference to FIGS. 1-8 and with reference to FIGS. 12-15. In still other variants, the dielectric structure can be molded in place on the wafer element, as by placing the mold onto the wafer element before introducing the dielectric material into the mold. In a further variant, the dielectric structure can be molded progressively and transferred progressively while it is being molded. For example, a mold may be placed over a portion of the wafer element and a portion of the dielectric structure as, for example, one or a few bumps, may be formed and bonded to the wafer element, whereupon the mold is removed and repositioned to form an additional portion of the dielectric structure, such as an additional bump or bumps, on another part of the wafer element.

In other variants, the electrically conductive features such as terminals and conductive strips can be applied to the dielectric structure before the dielectric structure is transferred to the wafer element. For example, a metal layer may be provided in the mold, so that the metal layer is applied to the dielectric structure when the same is formed. This metal layer may be etched after removing the dielectric structure from the mold, either before or after transferring the dielectric structure to the wafer element. Alternatively, pre-formed metallic elements may be placed in the mold.

Figure 27:
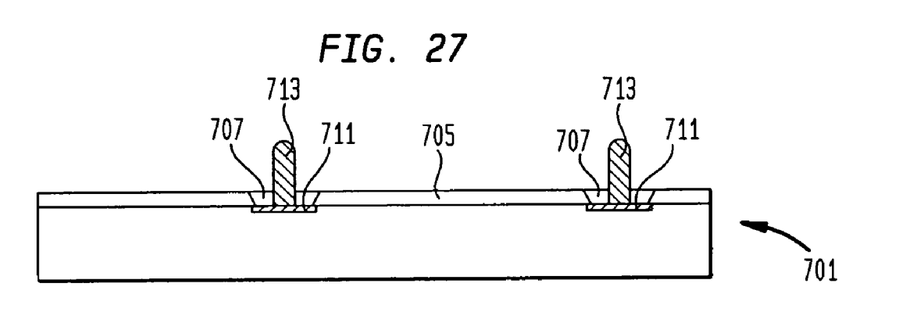
FIG. 27 is a fragmentary diagrammatic sectional view depicting portions of a structure according to a further embodiment of the invention.
Figure 28:
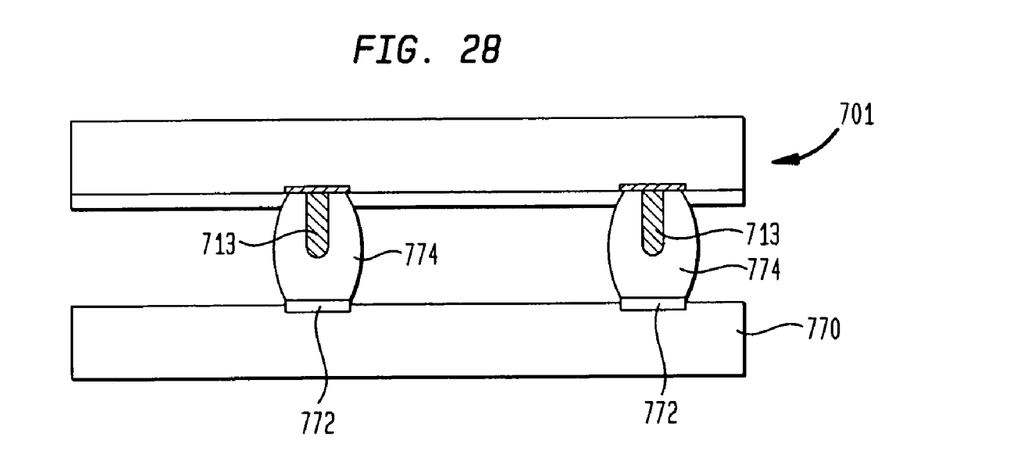
FIG. 28 is a view similar to FIG. 27 but depicting the structure in conjunction with a further component.

In a further variant, terminals having deformable posts as discussed with reference to FIGS. 12-21 may be provided on a body other than a composite body including a chip and dielectric structure. For example, such terminals may be provided on a "bare" chip 701 (FIG. 27), as by forming the posts on pads 711 formed integrally with the contacts on the chip. In such an embodiment, the posts desirably project upwardly beyond the front surface of the chip, and beyond any passivation layer 705 provided on the front surface. In the embodiment illustrated, the dielectric or passivation layer 705 has apertures 707 aligned with the contacts or pads 711, and the posts project through the apertures. Here again, the posts can be engaged with a test fixture (not shown). In this embodiment as well, the projecting posts facilitate engagement with the test fixture. After testing, the chip 701 may be mounted in a "flip chip" arrangement to a circuit panel 770 (FIG. 28), so that the front surface of the chip confronts the surface of the circuit panel. Solder masses are disposed between the contacts of the chip and the circuit panel and reflowed to form solder joints between the chip contacts and contact pads 772 of the circuit panel. Here again, the resulting solder joint 774 covers the full extent of the pad 711, leaving the posts 713 encapsulated within the solder joint.

As these and other variations and combinations of the features discussed above may be utilized without departing from the present invention, the foregoing description of the preferred embodiments should be taken by way of illustration rather than by limitation of the invention as defined by the claims.

The invention claimed is:

1. A method of making chip assemblies comprising:
   (a) forming a dielectric structure so that a first surface of the dielectric structure is shaped by a working surface of a mold;
   (b) transferring the dielectric structure onto a surface of a wafer element including one or more chip regions, so that the first surface of the dielectric structure faces away from the wafer element and a second surface of the dielectric structure faces toward the wafer element;
   (c) providing terminals on the first surface of the dielectric structure; and
   (d) electrically connecting the terminals to contacts of the wafer element.

2. A method as claimed in claim 1 wherein the forming step includes providing the dielectric structure with a plurality of spaced apart bumps projecting away from the second surface, and the step of providing terminals includes providing at least some of the terminals on the bumps.

3. A method as claimed in 2 wherein the dielectric structure includes gaps between the bumps.

4. A method as claimed in claim 3 wherein at least some of the bumps are isolated bumps remote from other portions of the dielectric structure, the method further comprising maintaining the isolated bumps in position relative to the other portions of the dielectric structure between the forming step and the transferring step.

5. A method as claimed in claim 4 wherein the dielectric structure consists solely of the isolated bumps.

6. A method as claimed in claim 1 wherein said forming step is performed so as to form cavities in said dielectric structure remote from said first surface, and said step of providing terminals is performed so as to provide at least some of said terminals in alignment with said cavities.

7. A method as claimed in claim 6 further comprising the step of providing vents open to outside of the chip assembly communicating with at least some of said cavities.

8. A method as claimed in 1 wherein the step of providing terminals includes providing a metallic layer on the working surface of the mold so that, during the forming step, the metallic layer is disposed between the first surface of the dielectric structure and the mold and transferring the metallic layer along with the dielectric structure during the transferring step.

9. A method as claimed in 1 wherein the step of providing terminals includes depositing a metallic layer on the first surface of the dielectric structure after the transferring step.

10. A method as claimed in claim 9 wherein the step of depositing a metallic layer includes depositing portions of the metallic layer on the front surface of the wafer and on contacts of the wafer element exposed at the front surface and patterning the metallic layer so that the metallic layer includes a plurality of separate metallic elements, each including a terminal on the dielectric structure and a trace connecting that terminal to a contact of the wafer element.

11. A method as claimed in claim 10 wherein the step of depositing the metallic layer includes forming a substantially continuous layer and the patterning step includes subdividing the continuous layer to form the separate metallic elements.

12. A method as claimed in claim 10 wherein the step of depositing the metallic layer includes selectively depositing a metal to form the metallic elements separate from one another.

13. A method as claimed in claim 1 wherein the transferring step includes placing the mold with the dielectric structure thereon over the front surface of the wafer element after the forming step, bonding the second surface of the dielectric structure to the front surface of the wafer element, and then removing the mold.

14. A method as claimed in claim 13 wherein the mold and the wafer element have substantially equal coefficients of thermal expansion.

15. A method as claimed in claim 1 wherein said forming step includes depositing an uncured, flowable dielectric material onto said working surface and then curing the dielectric material.

16. A method as claimed in claim 15 wherein said working surface includes a plurality of depressions and land regions between said depressions, said forming step further including removing dielectric material from said land regions before completion of said curing step.

17. A method as claimed in claim 15 wherein said curing step includes selectively exposing the uncured dielectric material to radiant energy so that portions of the dielectric material remain uncured, said forming step further comprising removing the uncured portions of the dielectric material.

18. A method as claimed in claim 1 wherein said forming step includes forming vent openings extending through said layer.

19. A method as claimed in claim 1 wherein said wafer element includes a plurality of chip regions, the method further comprising the step of severing the wafer and the dielectric structure after said transferring step to form a plurality of units, each including one or more of said chip regions and a portion of said dielectric structure.

* * * * *